US012587170B2

(12) United States Patent
Oshima

(10) Patent No.: US 12,587,170 B2
(45) Date of Patent: Mar. 24, 2026

(54) ACOUSTIC WAVE FILTER

(71) Applicant: Murata Manufacturing Co., Ltd.,
Nagaokakyo (JP)

(72) Inventor: Naoki Oshima, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 92 days.

(21) Appl. No.: 18/603,650

(22) Filed: Mar. 13, 2024

(65) Prior Publication Data

US 2024/0223158 A1     Jul. 4, 2024

Related U.S. Application Data

(63) Continuation of application No.
PCT/JP2022/034328, filed on Sep. 14, 2022.

(30) Foreign Application Priority Data

Sep. 14, 2021    (JP) ................................. 2021-149759

(51) Int. Cl.
H03H 9/64          (2006.01)
H04B 1/00          (2006.01)
(52) U.S. Cl.
CPC ......... H03H 9/6489 (2013.01); H04B 1/0057
(2013.01)
(58) Field of Classification Search
CPC ........ H03H 9/6489; H03H 9/145; H03H 9/64;
H03H 9/6483; H03H 9/6476; H03H
9/14541; H04B 1/0057
See application file for complete search history.

(56) References Cited

U.S. PATENT DOCUMENTS

2016/0173061 A1*   6/2016   Takamine ............ H03H 9/6433
                                                                            333/133
2017/0117873 A1*   4/2017   Takata ..................... H03H 9/54
2019/0149312 A1    5/2019   Takamine
(Continued)

FOREIGN PATENT DOCUMENTS

JP          2020053876 A      4/2020
JP          2021093710 A      6/2021
(Continued)

OTHER PUBLICATIONS

International Search Report in PCT/JP2022/034328, mailed Dec.
13, 2022, 3 pages.
(Continued)

*Primary Examiner* — John W Poos
(74) *Attorney, Agent, or Firm* — Keating & Bennett, LLP

(57)          ABSTRACT

An acoustic wave filter includes an acoustic wave resonant
circuit in or on at least one of a series arm or a parallel arm.
The acoustic wave resonant circuit includes divided resonant
devices connected to one another in series. A first divided
resonant device among the divided resonant devices
includes one first resonator. A second divided resonant
device among the divided resonant devices includes two
parallel divided resonators connected to each other in par-
allel. Each of the first resonator and the parallel divided
resonators includes an IDT electrode including electrode
fingers. An electrode finger pitch of the electrode fingers is
different between at least one of the parallel divided reso-
nators and the first resonator.

20 Claims, 13 Drawing Sheets

(56)                References Cited

U.S. PATENT DOCUMENTS

| | | | |
|---|---|---|---|
| 2019/0245516 A1* | 8/2019 | Taguchi | H03H 9/6466 |
| 2019/0305746 A1* | 10/2019 | Ota | H03H 9/64 |
| 2020/0153411 A1* | 5/2020 | Mukai | H03H 9/6493 |
| 2021/0184324 A1 | 6/2021 | Sato | |
| 2022/0200570 A1 | 6/2022 | Okada | |

FOREIGN PATENT DOCUMENTS

| | | |
|---|---|---|
| KR | 20190010606 A | 1/2019 |
| WO | 2018003297 A1 | 1/2018 |
| WO | 2018123775 A1 | 7/2018 |
| WO | 2021049206 A1 | 3/2021 |

OTHER PUBLICATIONS

Written Opinion in PCT/JP2022/034328, mailed Dec. 13, 2022, 4 pages.

* cited by examiner

COMPARATIVE EXAMPLE 1

| ITEM | FIRST RESONATOR | PARALLEL DIVIDED RESONATOR |
|---|---|---|
| IDT PAIR NUMBER | 492 | 192 |
| REFLECTOR PAIR NUMBER | 10 | 10 |
| CROSS WIDTH (μm) | 36.3 | 72.0 |
| ELECTRODE FINGER PITCH p (μm) | 0.8665 | 0.8665 |
| REFLECTOR PITCH (μm) | 0.8665 | 0.8665 |
| IDT DUTY | 0.55 | 0.55 |
| REFLECTOR DUTY | 0.55 | 0.55 |
| IR-GAP | 0.495 | 0.495 | p: PITCH IN ARRANGEMENT OF ELECTRODE FINGERS
OF IDT ELECTRODE

EXAMPLE 1

| ITEM | FIRST RESONATOR | PARALLEL DIVIDED RESONATOR |
|---|---|---|
| IDT PAIR NUMBER | 492 | 192 |
| REFLECTOR PAIR NUMBER | 10 | 10 |
| CROSS WIDTH (μm) | 36.3 | 72.0 |
| ELECTRODE FINGER PITCH p (μm) | 0.8660 | 0.8650 |
| REFLECTOR PITCH (μm) | 0.8660 | 0.8650 |
| IDT DUTY | 0.55 | 0.55 |
| REFLECTOR DUTY | 0.55 | 0.55 |
| IR-GAP | 0.495 | 0.495 | p: PITCH IN ARRANGEMENT OF ELECTRODE FINGERS
OF IDT ELECTRODE

FIG. 8A
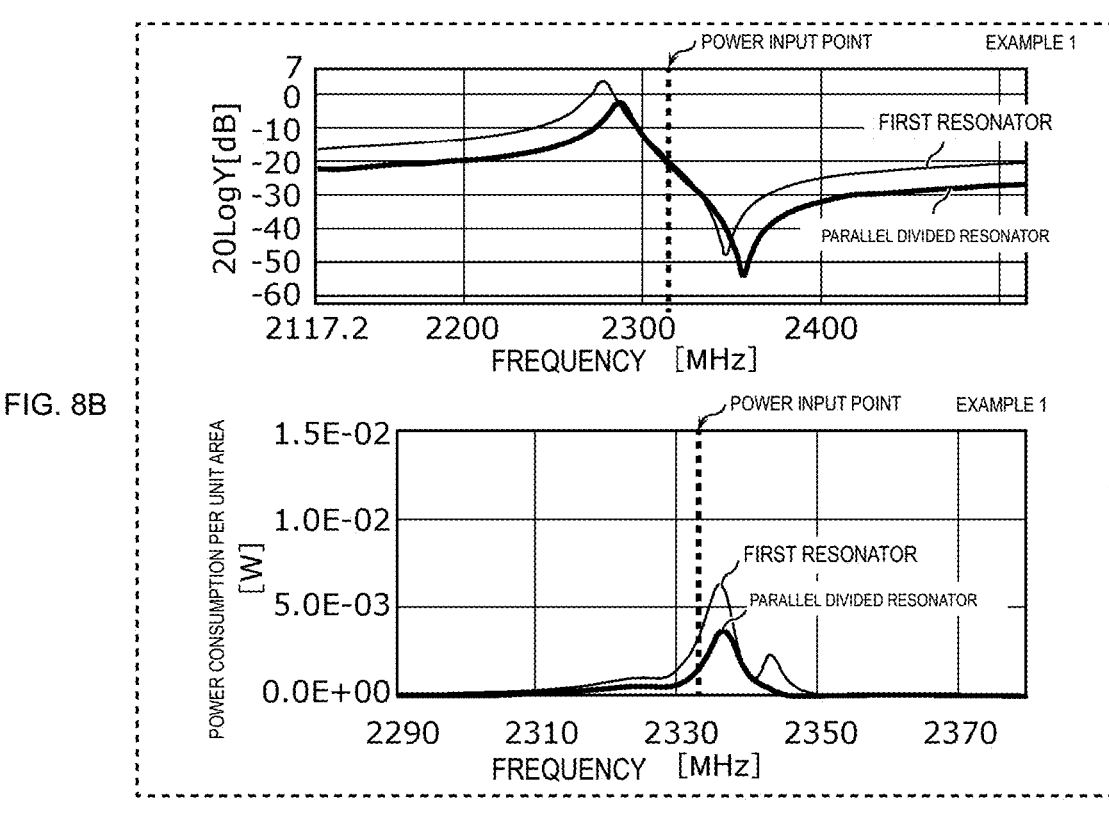
FIG. 8B
FIG. 9
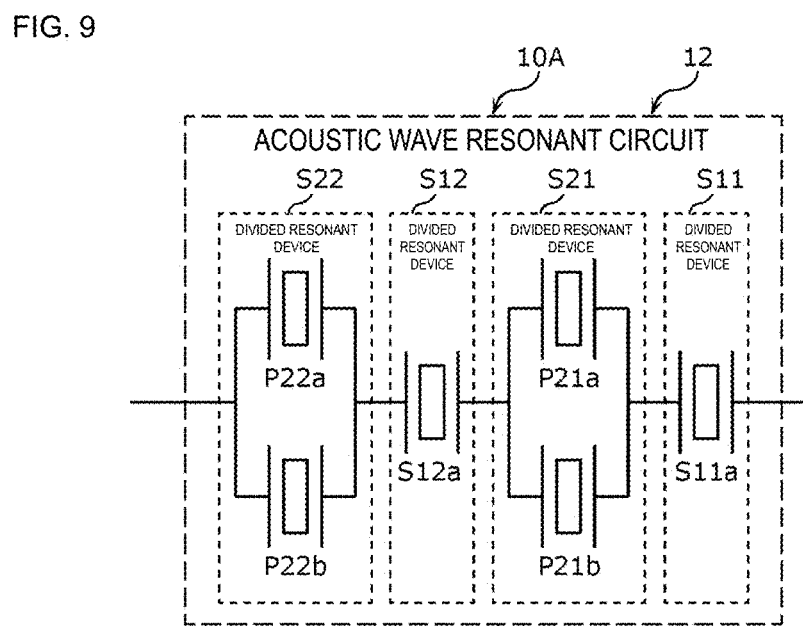

REFERENCE EXAMPLE

| ITEM | PARALLEL DIVIDED RESONATOR P21a, P22a | PARALLEL DIVIDED RESONATOR P21b, P22b |
|---|---|---|
| IDT PAIR NUMBER | 192 | 192 |
| REFLECTOR PAIR NUMBER | 10 | 10 |
| CROSS WIDTH (μm) | 72.0 | 72.0 |
| ELECTRODE FINGER PITCH p (μm) | 0.8650 | 0.8650 |
| REFLECTOR PITCH (μm) | 0.8650 | 0.8650 |
| IDT DUTY | 0.55 | 0.55 |
| REFLECTOR DUTY | 0.55 | 0.55 |
| IR-GAP | 0.495 | 0.495 | p: PITCH IN ARRANGEMENT OF ELECTRODE FINGERS
OF IDT ELECTRODE

EXAMPLE 2

| ITEM | PARALLEL DIVIDED RESONATOR P21a, P22a | PARALLEL DIVIDED RESONATOR P21b, P22b |
|---|---|---|
| IDT PAIR NUMBER | 192 | 192 |
| REFLECTOR PAIR NUMBER | 10 | 10 |
| CROSS WIDTH (μm) | 72.0 | 72.0 |
| ELECTRODE FINGER PITCH p (μm) | 0.8650 | 0.8646 |
| REFLECTOR PITCH (μm) | 0.8650 | 0.8646 |
| IDT DUTY | 0.55 | 0.55 |
| REFLECTOR DUTY | 0.55 | 0.55 |
| IR-GAP | 0.495 | 0.495 | p: PITCH IN ARRANGEMENT OF ELECTRODE FINGERS
OF IDT ELECTRODE

COMPARATIVE EXAMPLE 2

| ITEM | FIRST RESONATOR | PARALLEL DIVIDED RESONATOR |
|---|---|---|
| IDT PAIR NUMBER | 492 | 192 |
| REFLECTOR PAIR NUMBER | 10 | 10 |
| CROSS WIDTH (µm) | 36.3 | 72.0 |
| ELECTRODE FINGER PITCH p (µm) | 0.8665 | 0.8665 |
| REFLECTOR PITCH (µm) | 0.8665 | 0.8665 |
| IDT DUTY | 0.55 | 0.55 |
| REFLECTOR DUTY | 0.55 | 0.55 |
| IR-GAP | 0.495 | 0.495 | p: PITCH IN ARRANGEMENT OF ELECTRODE FINGERS
OF IDT ELECTRODE

FIG. 17

EXAMPLE 3

| ITEM | FIRST RESONATOR S11a | FIRST RESONATOR S12a | PARALLEL DIVIDED RESONATOR P21a, P22a | PARALLEL DIVIDED RESONATOR P21b, P22b |
|---|---|---|---|---|
| IDT PAIR NUMBER | 492 | 492 | 192 | 192 |
| REFLECTOR PAIR NUMBER | 10 | 10 | 10 | 10 |
| CROSS WIDTH (μm) | 36.3 | 36.3 | 72.0 | 72.0 |
| ELECTRODE FINGER PITCH p (μm) | 0.8660 | 0.8663 | 0.8658 | 0.8655 |
| REFLECTOR PITCH (μm) | 0.8660 | 0.8663 | 0.8658 | 0.8655 |
| IDT DUTY | 0.55 | 0.55 | 0.55 | 0.55 |
| REFLECTOR DUTY | 0.55 | 0.55 | 0.55 | 0.55 |
| IR-GAP | 0.495 | 0.495 | 0.495 | 0.495 | p: PITCH IN ARRANGEMENT OF ELECTRODE FINGERS
OF IDT ELECTRODE

ACOUSTIC WAVE FILTER

CROSS REFERENCE TO RELATED APPLICATIONS

This application claims the benefit of priority to Japanese Patent Application No. 2021-149759 filed on Sep. 14, 2021 and is a Continuation Application of PCT Application No. PCT/JP2022/034328 filed on Sep. 14, 2022. The entire contents of each application are hereby incorporated herein by reference.

BACKGROUND OF THE INVENTION

1. Field of the Invention

The present invention relates to acoustic wave filters each including an acoustic wave resonant circuit including a plurality of divided resonant devices.

2. Description of the Related Art

In the related art, a technology of dividing an acoustic wave resonant circuit into a plurality of divided resonant devices is known (for example, International Publication No. WO 2021/049206). By dividing the acoustic wave resonant circuit in such a manner, the power consumption per unit area can be reduced, and an electric power handling capability of an acoustic wave filter is improved.

For example, a divided resonant device is formed by an interdigital transducer (IDT) electrode. However, in a case where pitches in the arrangement of electrode fingers of the IDT electrodes of the plurality of divided resonant devices are the same, a temperature of the acoustic wave resonant circuit increases. Thus, the electric power handling capability of the acoustic wave filter may decrease.

SUMMARY OF THE INVENTION

Example embodiments of the present invention provide acoustic wave filters that are each able to reduce or prevent a decrease in electric power handling capability.

According to an example embodiment of the present invention, an acoustic wave filter includes an acoustic wave resonant circuit in or on at least one of a series arm or a parallel arm, in which the acoustic wave resonant circuit includes a plurality of divided resonant devices connected to one another in series, a first divided resonant device among the plurality of divided resonant devices includes one first resonator, a second divided resonant device among the plurality of divided resonant devices includes two parallel divided resonators connected to each other in parallel, each of the first resonator and the parallel divided resonators includes an IDT electrode including a plurality of electrode fingers, and an electrode finger pitch of the plurality of electrode fingers is different between at least one parallel divided resonator of the two parallel divided resonators and the first resonator.

According to an example embodiment of the present invention, an acoustic wave filter includes an acoustic wave resonant circuit in or on at least one of a series arm or a parallel arm, in which the acoustic wave resonant circuit includes a plurality of divided resonant devices connected to one another in series, a first divided resonant device among the plurality of divided resonant devices includes one first resonator, a second divided resonant device among the plurality of divided resonant devices includes two parallel divided resonators connected to each other in parallel, and a resonant frequency of at least one parallel divided resonator of the two parallel divided resonators is different from a resonant frequency of the first resonator.

According to example embodiments of the present invention, it is possible to reduce or prevent a decrease in electric power handling capability.

The above and other elements, features, steps, characteristics and advantages of the present invention will become more apparent from the following detailed description of the example embodiments with reference to the attached drawings.

BRIEF DESCRIPTION OF THE DRAWINGS

FIGS. 8A and 8B are diagrams showing admittance characteristics and power consumption of the first resonator and the parallel divided resonator according to Example 1.

FIG. 9 is a diagram showing divided resonant devices included in an acoustic wave resonant circuit of Example 2 and a reference example.

FIG. 17 is a diagram showing electrode finger pitches and the like of IDT electrodes of a first resonator and a parallel divided resonator according to Example 3.

DETAILED DESCRIPTION OF THE EXAMPLE EMBODIMENTS

Figure 1:
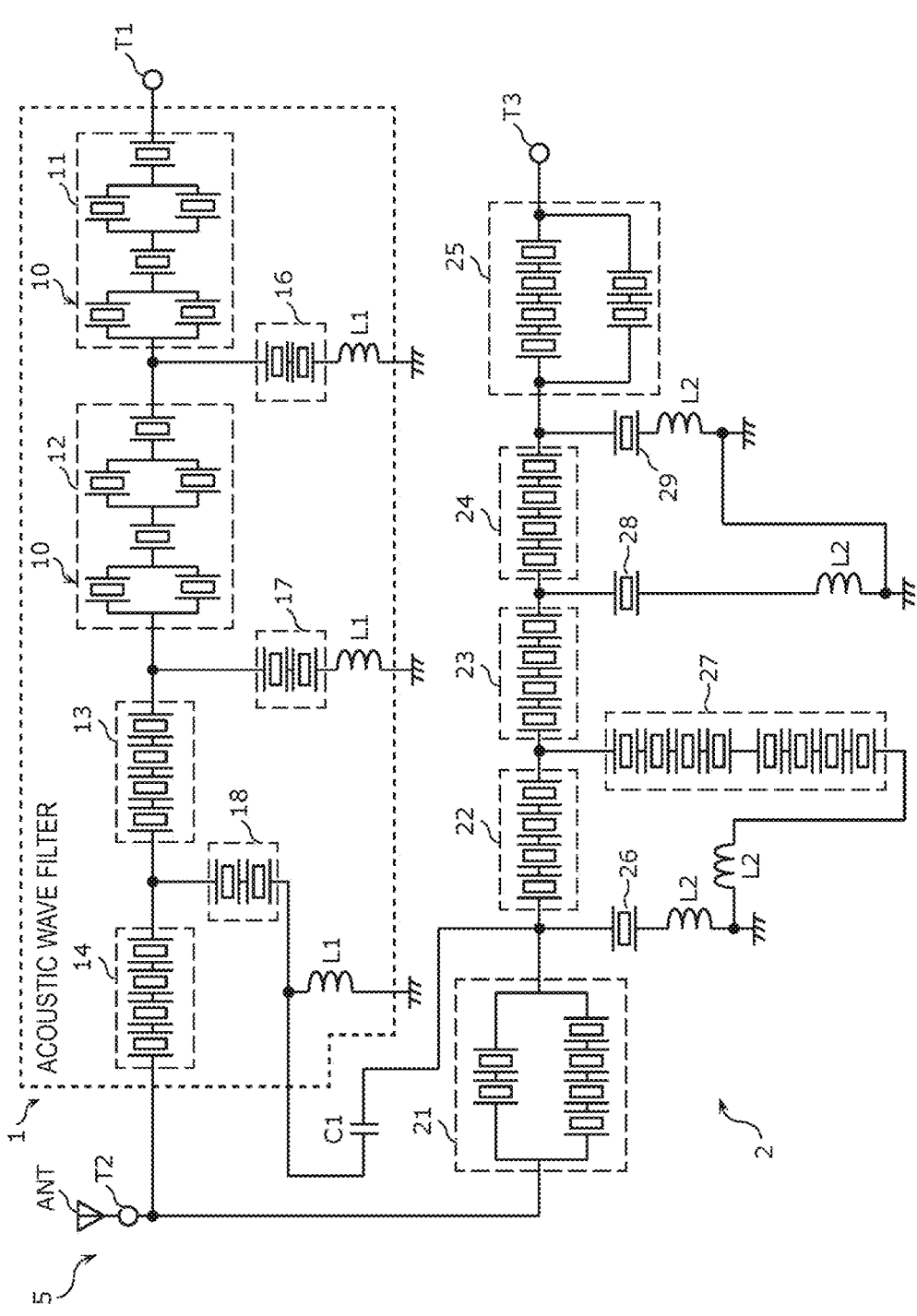
FIG. 1 is a circuit configuration diagram of a multiplexer including an acoustic wave filter according to an example embodiment of the present invention.

Hereinafter, example embodiments of the present invention will be described in detail with reference to accompanying drawings. All of the example embodiments described below describe comprehensive or specific examples. Numerical values, shapes, materials, elements, the arrangement and connection configuration of the elements, and so forth that are described in the following example embodiments are merely examples and are not intended to limit the present invention. Among the elements in the following example embodiments, an element that is not described in an independent claim is an optional element. Further, in each drawing, the same reference numerals denote the same or substantially the same configurations, and duplicate descriptions may be omitted or simplified. Furthermore, in the following description of example embodiments, the term "connected" is defined to include not only a case of being directly connected but also a case of being electrically connected via another element or the like.

EXAMPLE EMBODIMENT

Configuration of Acoustic Wave Filter

A configuration of an acoustic wave filter according to an example embodiment of the present invention will be described with reference to FIG. 1.

FIG. 1 is a circuit configuration diagram of a multiplexer 5 including an acoustic wave filter 1 according to the present example embodiment. An antenna ANT is also shown in FIG. 1.

The multiplexer 5 includes a first terminal T1, a second terminal T2, a third terminal T3, an acoustic wave filter 1, and another filter 2. The acoustic wave filter 1 is provided on a path connecting the first terminal T1 and the second terminal T2. The other filter 2 is provided on the path connecting the second terminal T2 and the third terminal T3. The antenna ANT is connected to the second terminal T2. The antenna ANT is a multiband compatible antenna that transmits and receives high frequency signals, for example, that is compliant with a communication standard such as the long term evolution (LTE).

The acoustic wave filter 1 includes a plurality of acoustic wave resonant circuits. Each acoustic wave resonant circuit of the acoustic wave filter 1 is, for example, a surface acoustic wave resonator. The surface acoustic wave also includes, for example, a surface wave, a Love wave, a leaky wave, a Rayleigh wave, a leakage SAW, a pseudo SAW, and a plate wave. The acoustic wave resonant circuit may be, for example, a boundary acoustic wave resonator.

The acoustic wave filter 1 includes series arm resonant circuits 11, 12, 13, and 14, and parallel arm resonant circuits 16, 17, and 18 which are acoustic wave resonant circuits. Further, the acoustic wave filter 1 includes a plurality of inductors L1. The plurality of inductors L1 each include one end which is connected to the respective parallel arm resonant circuits 16 to 17 and another end which is connected to the ground. The series arm resonant circuits 11 to 14 and the parallel arm resonant circuits 16 to 18 define a pass band of the acoustic wave filter 1. Each inductor L1 is an element to adjust the pass band of the acoustic wave filter 1.

The series arm resonant circuits 11 to 14 are connected to one another in series on a path connecting the first terminal T1 and the second terminal T2. Among the series arm resonant circuits 11 to 14, the series arm resonant circuit 11 is a resonator closest to the first terminal T1, and the series arm resonant circuit 12 is a resonator close to the first terminal T1 which is next to the series arm resonant circuit 11.

In a case where the acoustic wave filter 1 is a transmission filter, high power may be input to the series arm resonant circuits 11 and 12 as compared with the other series arm resonant circuits 13 and 14 and the other filter 2.

The parallel arm resonant circuit 16 is connected between the inductor L1 and the node on the path between the series arm resonant circuit 11 and the series arm resonant circuit 12. The parallel arm resonant circuit 17 is connected between the inductor L1 and the node on the path between the series arm resonant circuit 12 and the series arm resonant circuit 13. The parallel arm resonant circuit 18 is connected between the inductor L1 and the node on the path between the series arm resonant circuit 13 and the series arm resonant circuit 14.

According to the above-described configuration of the acoustic wave filter 1, the series arm resonant circuits 11 to 14 defined by an acoustic wave resonant circuit are disposed in the series arm path, and the parallel arm resonant circuits 16 to 18 defined by the acoustic wave resonant circuit are disposed in the parallel arm path. Therefore, it is possible to provide, for example, a ladder acoustic wave filter having a low-loss pass band and a steep transition band from the pass band to the stopband.

The other filter 2 includes series arm resonant circuits 21, 22, 23, 24, and 25 and parallel arm resonant circuits 26, 27, 28, and 29 which are acoustic wave resonant circuits. Further, the other filter 2 includes a plurality of inductors L2 connected to the ground.

The series arm resonant circuits 21 to 25 are connected to one another in series on a path connecting the second terminal T2 and the third terminal T3. The parallel arm resonant circuit 26 is connected between the inductor L2 and the node on the path between the series arm resonant circuit 21 and the series arm resonant circuit 22. The parallel arm resonant circuit 27 is connected between the inductor L2 and the node on the path between the series arm resonant circuit 22 and the series arm resonant circuit 23. The parallel arm resonant circuit 28 is connected between the inductor L2 and the node on the path between the series arm resonant circuit 23 and the series arm resonant circuit 24. The parallel arm resonant circuit 29 is connected between the inductor 12 and the node on the path between the series arm resonant circuit 24 and the series arm resonant circuit 25. A capacitive element C1 is provided on a path connecting the node between the parallel arm resonant circuit 18 and the inductor L1 to the series arm resonant circuit 21 and the series arm resonant circuit 22.

Each of the series arm resonant circuits 11 to 14 and 21 to 25 and the parallel arm resonant circuits 16 to 18 and 27 shown in FIG. 1 includes a divided resonant device group including at least one of a plurality of divided resonant devices connected to one another in series or a plurality of divided resonant devices connected to one another in parallel.

The plurality of divided resonant devices connected to one another in series are not connected to the other elements at nodes connected to the plurality of divided resonant devices adjacent to one another, and the nodes are not connected to the ground. In addition, in each of the plurality of divided resonant devices, a passive element including both ends, which are connected to the divided resonant device, is also regarded as a portion of the divided resonant device. Further, in the plurality of divided resonant devices connected to one another in parallel, respective one ends of the plurality of divided resonant devices are connected to one another, and the respective other ends of the plurality of divided resonant devices are connected to one another. Another element is not connected between one end of each of the divided resonant devices and the other end of each of the plurality of divided resonant devices. In addition, in each of the plurality of divided resonant devices, a passive element including both ends, which are connected to the divided resonant device, is also regarded as a portion of the divided resonant device.

The divided resonant device refers to each one of a plurality of resonant devices defining the divided resonant device group. The divided resonant device groups are, for example, the series arm resonant circuits 11 to 14 and 21 to 25 or the parallel arm resonant circuits 16 to 18 and 27, and the divided resonant devices are some of the series arm resonant circuits 11 to 14 and 21 to 25 or some of the parallel arm resonant circuits 16 to 18 and 27. Each of the series arm resonant circuits 11 to 14 and 21 to 25 and the parallel arm resonant circuits 16 to 18 and 27 shown in FIG. 1 is an aggregate of the plurality of divided resonant devices, and is not a single divided resonant device. Each of the series arm resonant circuits 11 to 14 and 21 to 25 and the parallel arm resonant circuits 16 to 18 and 27 shown in FIG. 1 does not include one divided resonant device, but includes the plurality of divided resonant devices. The parallel arm resonant circuits 26, 28, and 29 shown in FIG. 1 are not divided resonant devices.

The series arm resonant circuits 11 to 14 and 21 to 25 or the parallel arm resonant circuits 16 to 18 and 27, which are a divided resonant device group, include a plurality of IDT electrodes, and the plurality of divided resonant devices included in the divided resonant device group correspond to the plurality of IDT electrodes in one-to-one manner.

Here, in a case where the pitches the electrode fingers of the IDT electrodes of the plurality of divided resonant devices included in the divided resonant device group are the same or substantially the same, the temperatures of the series arm resonant circuits 11 to 14 and 21 to 25 and the parallel arm resonant circuits 16 to 18 and 27 increase, and the electric power handling capability of the acoustic wave filter 1 decreases.

Hereinafter, the acoustic wave resonant circuit 10, to which the present invention is applied to solve such a problem, will be described.

Configuration of Acoustic Wave Resonant Circuit

A configuration of the acoustic wave resonant circuit 10 included in the acoustic wave filter 1 will be described with reference to FIGS. 2 to 4.

Figure 2:
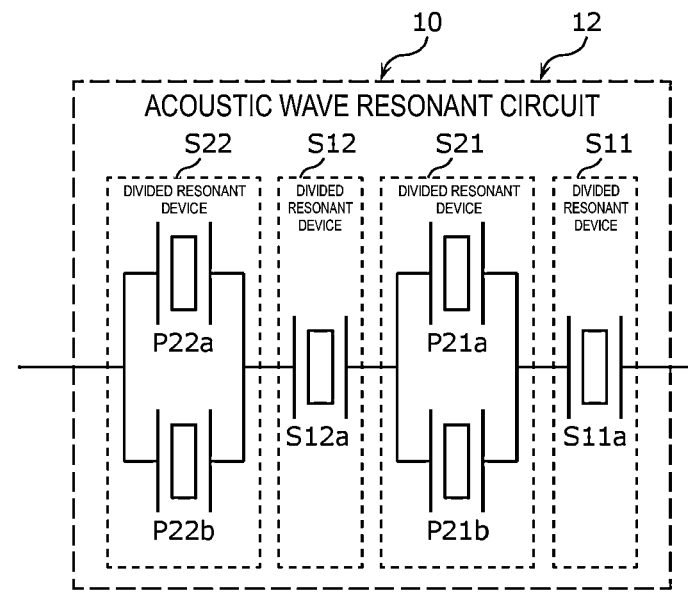
FIG. 2 is a circuit configuration diagram showing divided resonant devices included in an acoustic wave resonant circuit of an acoustic wave filter according to an example embodiment of the present invention.

FIG. 2 is a circuit configuration diagram showing the acoustic wave resonant circuit 10 included in the acoustic wave filter 1.

In FIG. 2, the series arm resonant circuit 12 will be described as an example of the acoustic wave resonant circuit 10, and the same applies to the series arm resonant circuit 11.

The acoustic wave resonant circuit 10 includes the plurality of divided resonant devices connected to one another in series. For example, the acoustic wave resonant circuit 10 includes four divided resonant devices including a first divided resonant device S11, a second divided resonant device S21, a first divided resonant device S12, and a second divided resonant device S22.

The first divided resonant devices S11 and S12 and the second divided resonant devices S21 and S22 shown in FIG. 2 are alternately disposed on the path connecting the first terminal T1 and the second terminal T2. For example, one end of the second divided resonant device S21 is connected in series to the first divided resonant device S11, one end of the first divided resonant device S12 is connected in series to the other end of the second divided resonant device S21, and the second divided resonant device S22 is connected in series to the other end of the first divided resonant device S12.

The first divided resonant device S11 includes one first resonator S11a, and the first divided resonant device S12 includes one first resonator S12a. The second divided resonant device S21 includes two parallel divided resonators P21a and P21b connected to each other in parallel, and the second divided resonant device S22 includes two parallel divided resonators P22a and P22b connected to each other in parallel. The first resonator S11a is connected in series to the second divided resonant device S21, and the first resonator S11a itself is not divided in parallel. The first resonator S12a is inserted in series between the second divided resonant devices S21 and S22, and the first resonator S12a itself is not divided in parallel. The second divided resonant device S21 includes a plurality of divided resonant devices (parallel divided resonators P21a and P21b) connected to each other in parallel. The second divided resonant device S22 includes a plurality of divided resonant devices (parallel divided resonators P22a and P22b) connected to each other in parallel. Each of the second divided resonant devices S21 and S22 may include three or more parallel divided resonators.

Each of the first resonators S11a and S12a and the parallel divided resonators P21a, P21b, P22a, and P22b is defined by an IDT electrode.

Figure 3:
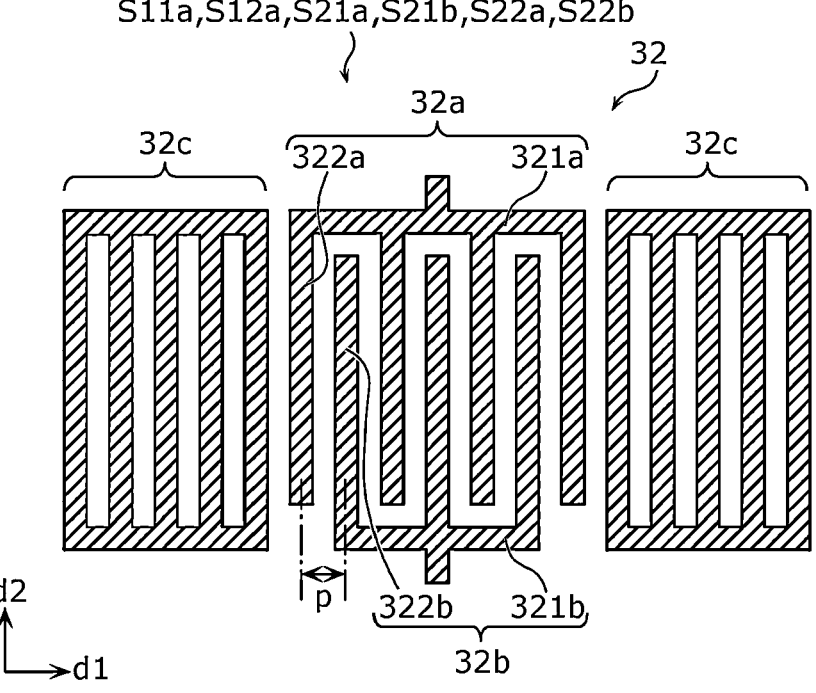
FIG. 3 is a plan view schematically showing an IDT electrode of a first resonator or a parallel divided resonator included in the divided resonant device of FIG. 2.

FIG. 3 is a plan view schematically showing an IDT electrode 32 of the first resonators S11a and S12a or the parallel divided resonators P21a, P21b, P22a, and P22b included in the divided resonant devices. FIG. 3 also shows a reflector 32c.

As shown in FIG. 3, the IDT electrode 32 includes a pair of comb-shaped electrodes 32a and 32b. One comb-shaped electrode 32a includes a plurality of electrode fingers 322a parallel or substantially parallel to one another and a busbar electrode 321a that connects each one end of the plurality of electrode fingers 322a. The other comb-shaped electrode 32b includes a plurality of electrode fingers 322b parallel or substantially parallel to one another and a busbar electrode 321b that connects each one end of the plurality of electrode fingers 322b. Each of the busbar electrodes 321a and 321b extends along a propagation direction d1 of the acoustic wave. The pluralities of electrode fingers 322a and 322b extend in a direction orthogonal or substantially orthogonal to the propagation direction d1 of the acoustic wave. The pluralities of electrode fingers 322a and 322b are interdigitated with each other in the extending direction of the electrode fingers 322a and 322b (hereinafter, referred to as a "direction d2 in which the electrode fingers extend"), and face the propagation direction d1 of the acoustic wave.

Here, pitches of the pluralities of electrode fingers 322a and 322b, which are distances between the centers of the electrode fingers 322a and 322b adjacent in the propagation direction d1 of the acoustic waves, are referred to as an electrode finger pitch p. In addition, in a case where the pitches of the pluralities of electrode fingers 322a and 322b in the IDI electrode 32 are different, the electrode finger pitch p is represented by an average of the pitches in arrangement. Specifically, the electrode finger pitch p is calculated by dividing a distance between centers of an electrode finger of one end of the IDT electrode 32 and an electrode finger of the other end of the IDT electrode 32 in the propagation direction d1 of the acoustic wave by a value which is obtained by subtracting 1 from the number of electrode fingers of the IDT electrode 32. In the present specification, the electrode finger pitch p is represented by the average in a case where the pitches of the pluralities of electrode fingers 322a and 322b in the IDT electrode 32 are the same or different.

In the present example embodiment, the electrode finger pitch p, which is the pitch of the pluralities of electrode fingers 322a and 322b, is different between the parallel divided resonators P21a, P21b, P22a, and P22b and the first resonators S11a and S12a. Hereinafter, any one first resonator of the first resonators S11a and S12a and any one parallel divided resonator of the parallel divided resonators P21a, P21b, P22a, and P22b will be described as examples.

Figures 4, 5:
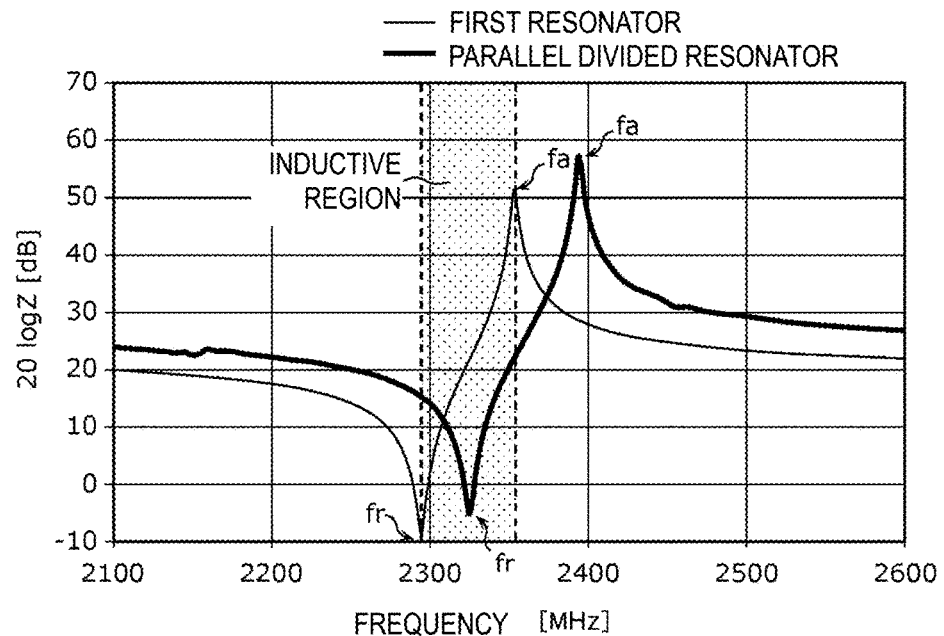
FIG. 4 is a diagram showing an example of impedance characteristics of the first resonator or the parallel divided resonator included in the divided resonant device of FIG. 2.
FIG. 5 is a diagram showing electrode finger pitches and the like of IDT electrodes of a first resonator and a parallel divided resonator according to Comparative Example 1.

FIG. 4 is a diagram showing an example of impedance characteristics of the first resonator or the parallel divided resonator included in the divided resonant device.

FIG. 4 shows an example in which the electrode finger pitch p of the parallel divided resonator is less than the electrode finger pitch p of the first resonator. In other words, FIG. 4 shows an example in which a wavelength of the parallel divided resonator is shorter than a wavelength of the first resonator and a resonant frequency fr of the parallel divided resonator is higher than a resonant frequency fr of the first resonator. In this example, the electrode finger pitch p of the parallel divided resonator is adjusted such that the resonant frequency fr of the parallel divided resonator is positioned in an inductive region (hatched region in FIG. 4) between the resonant frequency fr and the anti-resonant frequency fa of the first resonator.

For example, in a case where the electrode finger pitches of the parallel divided resonator and the first resonator are the same or substantially the same, the resonant frequencies of the parallel divided resonator and the first resonator are the same or substantially the same.

Therefore, a power consumption at a power input point increases, and a temperature of the acoustic wave resonant circuit 10 rises.

Meanwhile, in the example shown in FIG. 4, the electrode finger pitch p of the parallel divided resonator is set to be less than the electrode finger pitch p of the first resonator, and the resonant frequency fr of the parallel divided resonator is positioned in the inductive region of the first resonator. As a result, the power input point of the acoustic wave resonant circuit 10 approaches the resonant frequency fr of the parallel divided resonator (approaches a short shown on a Smith chart), and the impedance of the acoustic wave resonant circuit 10 decreases. Thus, a peak value of the power consumption of the acoustic wave resonant circuit 10 decreases, and temperature rise of the acoustic wave resonant circuit 10 can be reduced or prevented.

As described above, the power consumption of the acoustic wave resonant circuit 10 can be reduced by making the electrode finger pitch p of the parallel divided resonator different from the electrode finger pitch p of the first resonator and by shifting the resonant frequencies fr from each other. Thus, it is possible to reduce or prevent the temperature rise of the acoustic wave resonant circuit 10 and to reduce or prevent the decrease in electric power handling capability of the acoustic wave filter 1.

In the above description, for example, the fact that the electrode finger pitches p are different means that a value of a fraction is about 0.001 or more in a case where a denominator thereof is the electrode finger pitch p of the first resonator, and a numerator thereof is a difference between the electrode finger pitch p of the parallel divided resonator and the electrode finger pitch p of the first resonator. Further, in the above description, for example, the fact that the resonant frequencies fr are different means that a value of the fraction is about 0.001 or more in a case where a denominator thereof is the resonant frequency of the first resonator and a numerator thereof is a difference between the resonant frequency of the parallel divided resonator and the resonant frequency of the first resonator.

Hereinafter, the power consumption of the acoustic wave resonant circuit will be described as a specific example.

Example 1

The power consumption of the first resonator and the parallel divided resonator included in the acoustic wave resonant circuit 10 will be described with reference to Comparative Example 1 and Example 1.

Circuit configurations of the acoustic wave resonant circuits 10 of Comparative Example 1 and Example 1 are the same or substantially the same as those of the example embodiment. Example 1 will describe an example in which the electrode parameters of the IDT electrode 32 of the first resonator and the parallel divided resonator are different.

FIG. 5 is a diagram showing the electrode finger pitches p and the like of the IDT electrode 32 of the first resonator and the parallel divided resonator according to Comparative Example 1.

As shown in FIG. 5, in Comparative Example 1, the electrode finger pitch p of the IDT electrode 32 has the same value as the first resonator and the parallel divided resonator.

Figures 6A, 6B, 7:
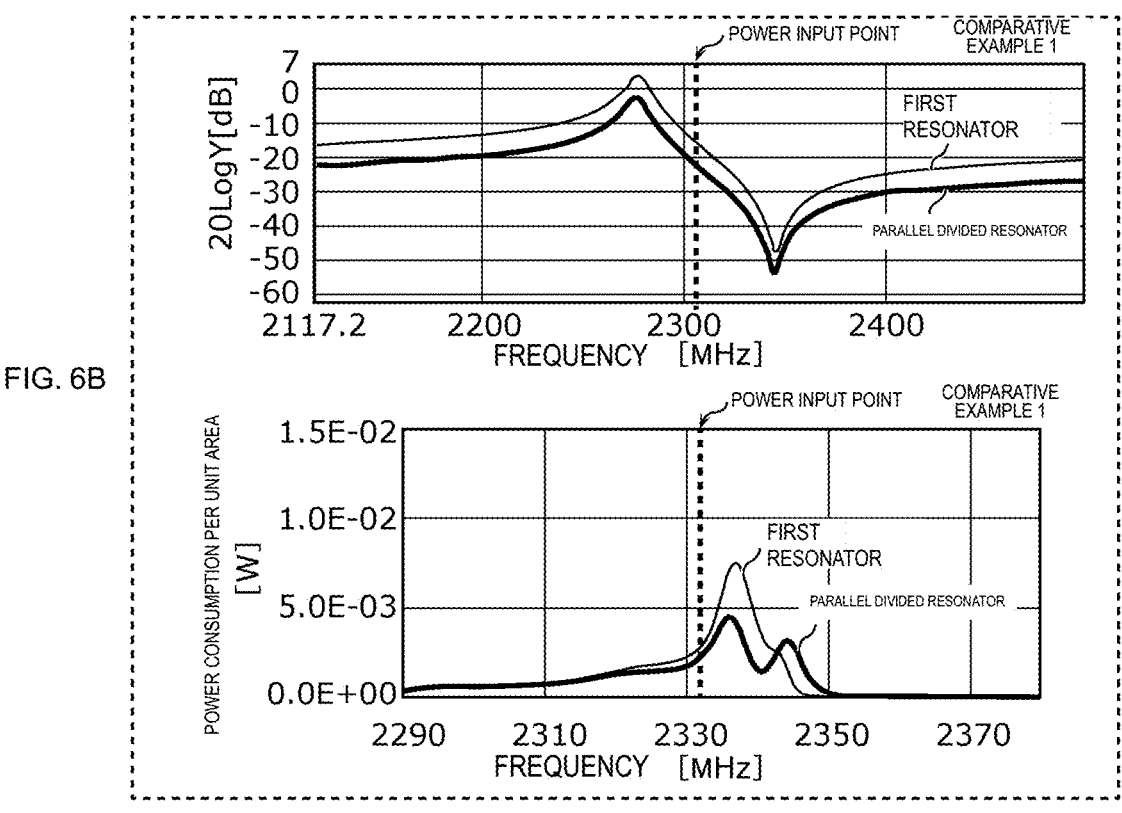
FIGS. 6A and 6B are diagrams showing admittance characteristics and power consumption of the first resonator and the parallel divided resonator according to Comparative Example 1.
FIG. 7 is a diagram showing electrode finger pitches and the like of IDT electrodes of a first resonator and a parallel divided resonator according to Example 1.

FIGS. 6A and 6B are diagrams showing admittance characteristics and power consumption of the first resonator and the parallel divided resonator according to Comparative Example 1. FIG. 6A shows the admittance characteristics, and FIG. 6B shows the power consumption per unit area.

As shown in FIG. 6A, the resonant frequencies of the first resonator and the parallel divided resonator are the same or substantially the same frequency. As shown in FIG. 6B, the power consumption at the power input point is a value obtained by totaling the power consumption of the first resonator and the power consumption of the parallel divided resonator.

FIG. 7 is a diagram showing the electrode finger pitches p and the like of the IDT electrode 32 of the first resonator and the parallel divided resonator according to Example 1.

As shown in FIG. 7, in Example 1, the electrode finger pitches p have different values between the parallel divided resonator and the first resonator. Specifically, the electrode finger pitch p of the parallel divided resonator is less than the electrode finger pitch p of the first resonator. In other words, the electrode finger pitch p of the first resonator is greater than the electrode finger pitch p of the parallel divided resonator.

FIGS. 8A and 8B diagrams showing the admittance characteristics and the power consumption of the first resonator and the parallel divided resonator according to Example 1. FIG. 8A shows the admittance characteristics, and FIG. 8B shows the power consumption per unit area.

In the example shown in FIG. 8A, the resonant frequency of the parallel divided resonator moves to the high frequency side, and the resonant frequency of the parallel divided resonator is higher than the resonant frequency of the first resonator. Therefore, as shown in FIG. 8B, the power consumption at the power input point is less than that of Comparative Example 1. As described above, by making the electrode finger pitch p of the parallel divided resonator less than the electrode finger pitch p of the first resonator, the power consumption of the acoustic wave resonant circuit 10 can be reduced.

Example 2

The power consumption of the first resonator and the parallel divided resonator included in the acoustic wave resonant circuit 10A will be described with reference to a reference example and Example 2. The reference example is not an example of the related art but an example of the present invention.

FIG. 9 is a diagram showing the divided resonant devices included in the acoustic wave resonant circuit 10A of Example 2 and the reference example. Circuit configurations of the acoustic wave resonant circuits 10A of the reference example and Example 2 are the same or substantially the same as those of the above-described example embodiment. Example 2 will describe an example in which the electrode parameters of the IDT electrodes 32 of the two parallel divided resonators included in the second divided resonant device are different.

Figures 10, 11:
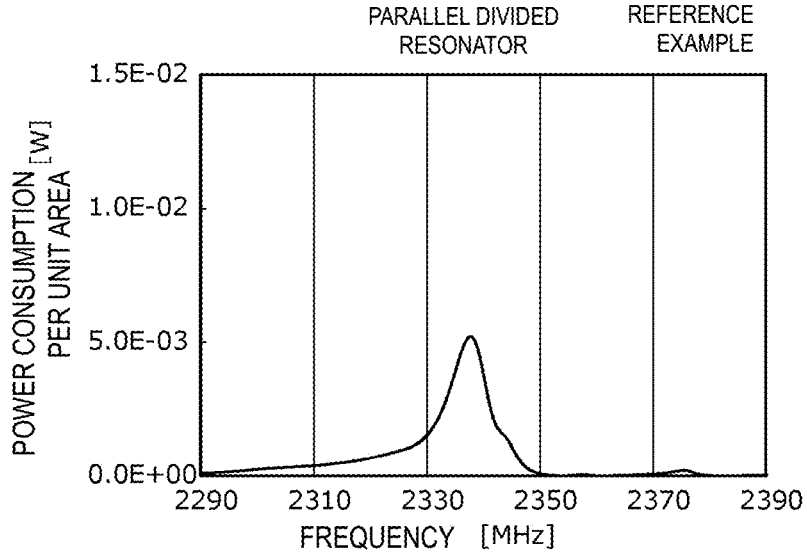
FIG. 10 is a diagram showing electrode finger pitches and the like of IDT electrodes of two parallel divided resonators according to the reference example.
FIG. 11 is a diagram showing power consumption of the two parallel divided resonators according to the reference example.

FIG. 10 is a diagram showing the electrode finger pitches p and the like of the IDT electrodes 32 of two parallel divided resonators according to the reference example. As shown in FIG. 10, in the reference example, the electrode finger pitches p have the same or substantially the same value as the parallel divided resonators P21*a* and P22*a* and the parallel divided resonators P21*b* and P22*b*.

FIG. 11 is a diagram showing the power consumption of the parallel divided resonator according to the reference example. FIG. 11 shows the power consumption of any one of the parallel divided resonators P21*a*, P21*b*, P22*a*, and P22*b*.

Figures 12, 13:
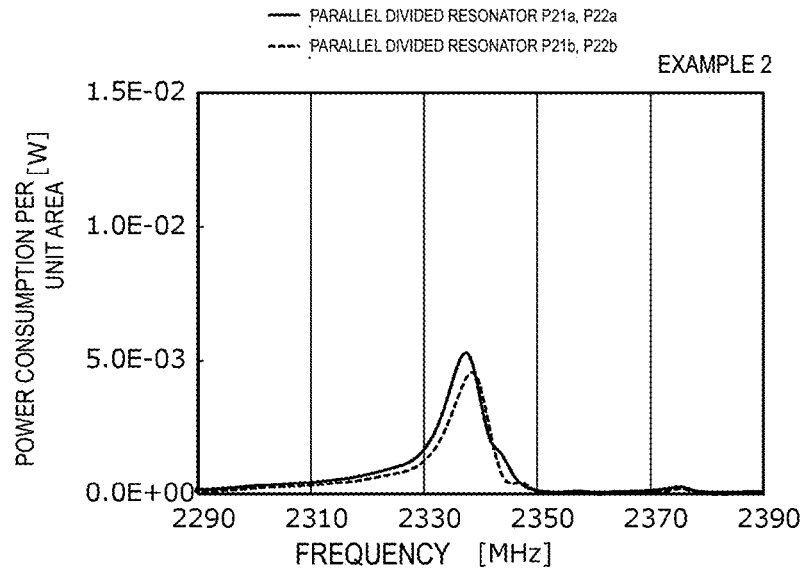
FIG. 12 is a diagram showing electrode finger pitches and the like of IDT electrodes of two parallel divided resonators according to Example 2.
FIG. 13 is a diagram showing power consumption of the two parallel divided resonators according to Example 2.

FIG. 12 is a diagram showing the electrode finger pitches p and the like of the IDT electrodes 32 of the two parallel divided resonators according to Example 2. Hereinafter, in the parallel divided resonators P21*a*, P21*b*, P22*a*, and P22*b*, the two parallel divided resonators P21*a* and P21*b* included in the second divided resonant device S21 will be described as an example. The two parallel divided resonators P22*a* and P22*b* included in the second divided resonant device S22 also have the same or substantially the same relationship as the two parallel divided resonators P21*a* and P21*b*.

As shown in FIG. 12, in Example 2, the electrode finger pitches p have different values between the parallel divided resonator P21*a* and the parallel divided resonator P21*b*. Specifically, the electrode finger pitch p of the parallel divided resonator P21*b* is less than the electrode finger pitch p of the parallel divided resonator P21*a*.

The electrode finger pitches p of the first resonators S11*a* and S12*a* have the same or substantially the same value. Further, the maximum value of the electrode finger pitches p of the two parallel divided resonators P21*a* and P21*b* is set to be less than the minimum value of the electrode finger pitches p of the first resonators S11*a* and S12*a*.

FIG. 13 is a diagram showing the power consumption of the two parallel divided resonators P21*a* and P21*b* according to Example 2. FIG. 13 also shows the power consumption of the parallel divided resonators P22*a* and P22*b*.

In the example shown in FIG. 13, the resonant frequency of the parallel divided resonator P21*b* moves to the high frequency side, and the resonant frequency of the parallel divided resonator P21*b* is higher than the resonant frequency of the parallel divided resonator P21*a*. As described above, the resonant frequencies of the two parallel divided resonators P21*a* and P21*b* can be shifted by making the electrode finger pitch p of one parallel divided resonator P21*a* different from the electrode finger pitch p of the other parallel divided resonator P21*b*. Thus, the power consumption of the acoustic wave resonant circuit 10A can be reduced.

In the present example, the fact that the electrode finger pitches p are different means that a value of a fraction is about 0.0004 or more in a case where a denominator thereof is the electrode finger pitch p of one parallel divided resonator and a numerator thereof is the difference between the electrode finger pitch p of one parallel divided resonator and the electrode finger pitch p of the other parallel divided resonator. Further, in the present example, the fact that the resonant frequencies fr are different means that a value of a fraction is about 0.0004 or more in a case where a denominator thereof is the resonant frequency of one parallel divided resonator and a numerator is the difference between the resonant frequency of the one parallel divided resonator and the resonant frequency of the other parallel divided resonator.

Example 3

The power consumption of the first resonator and the parallel divided resonator included in the acoustic wave resonant circuit 10B will be described with reference to Comparative Example 2 and Example 3.

Figures 14, 15:
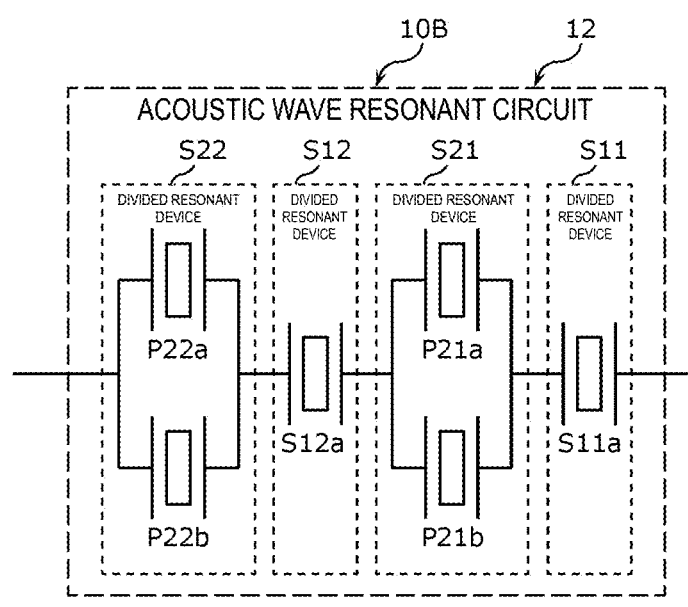
FIG. 14 is a diagram showing divided resonant devices included in an acoustic wave resonant circuit of Example 3 and Comparative Example 2.
FIG. 15 is a diagram showing electrode finger pitches and the like of IDT electrodes of a first resonator and a parallel divided resonator according to Comparative Example 2.

FIG. 14 is a diagram showing the divided resonant devices included in the acoustic wave resonant circuit 10B of Example 3 and Comparative Example 2. Circuit configurations of the acoustic wave resonant circuits 10B of Comparative Example 2 and Example 3 are the same or substantially the same as those of the example embodiment. Example 3 will describe an example in which the electrode parameters of the IDT electrodes 32 of the two first resonators are different and an example in which the electrode parameters of the IDT electrodes 32 of the two parallel divided resonators included in the second divided resonant device are different.

FIG. 15 is a diagram showing the electrode finger pitches p and the like of the IDT electrode 32 of the first resonator and the parallel divided resonator according to Comparative Example 2. As shown in FIG. 15, in Comparative Example 2, the electrode finger pitches p have the same or substantially the same values in the first resonators S11*a* and S12*a*. Further, in Comparative Example 2, the electrode finger pitches p have the same or substantially the same values as the parallel divided resonators P21*a* and P22*a* and the parallel divided resonators P21*b* and P22*b*.

Figure 16A:
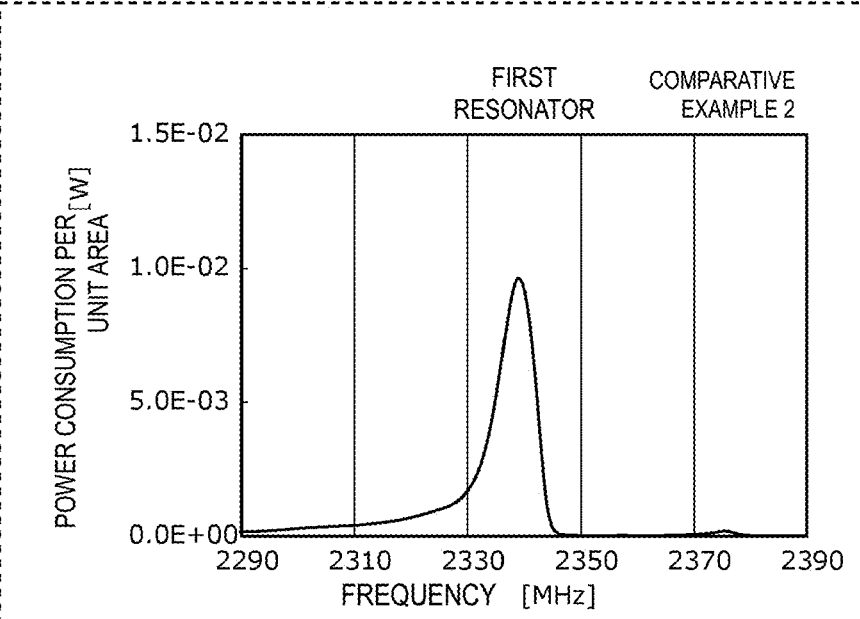
FIGS. 16A and 16B are diagrams showing power consumption of the first resonator and the parallel divided resonator according to Comparative Example 2.
Figure 16B:
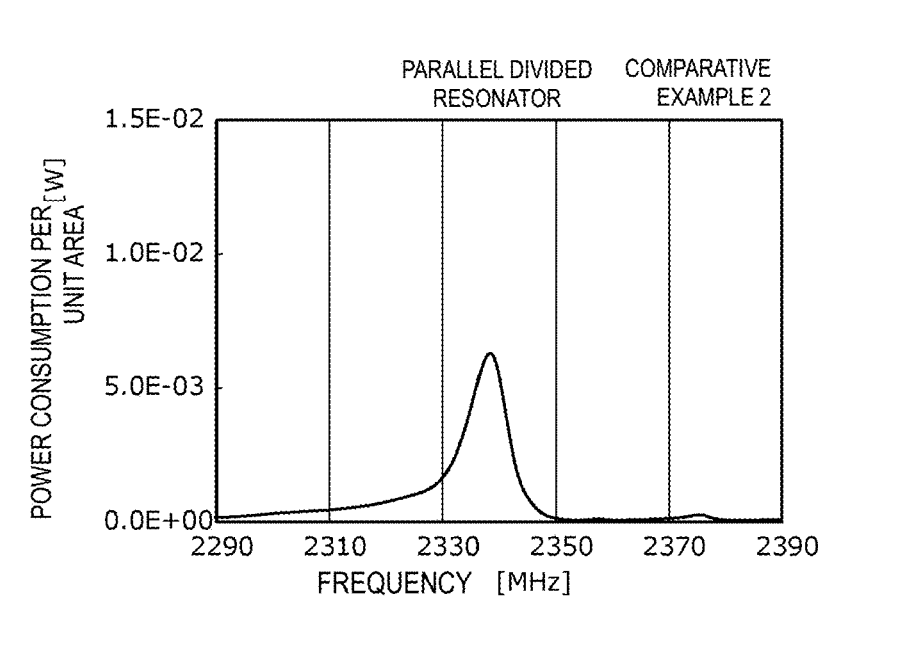

FIGS. 16A and 16B are diagrams showing the power consumption of the first resonator and the parallel divided resonator according to Comparative Example 2. FIG. 16A shows the power consumption of any one first resonator of the first resonators S11*a* and S12*a*, and FIG. 16B shows the power consumption of any one parallel divided resonator of the parallel divided resonators P21*a*, P21*b*, P22*a*, and P22*b*.

FIG. 17 is a diagram showing the electrode finger pitches p and the like of the IDT electrodes 32 of the first resonator and the parallel divided resonator according to Example 3.

As shown in FIG. 17, in Example 3, the electrode finger pitches p have different values between the first resonator S11*a* and the first resonator S12*a*. Specifically, the electrode finger pitch p of the first resonator S11*a* is less than the electrode finger pitch p of the first resonator S12*a*. Further, in Example 3, the electrode finger pitches p have different values between the parallel divided resonator P21*a* and the parallel divided resonator P21*b*. Specifically, the electrode finger pitch p of the parallel divided resonator P21*b* is less than the electrode finger pitch p of the parallel divided resonator P21*a*. The maximum value of the electrode finger pitches p of the two parallel divided resonators P21*a* and P21*b* is less than the minimum value of the electrode finger pitches p of the first resonators S11*a* and S12*a*.

Figure 18A:
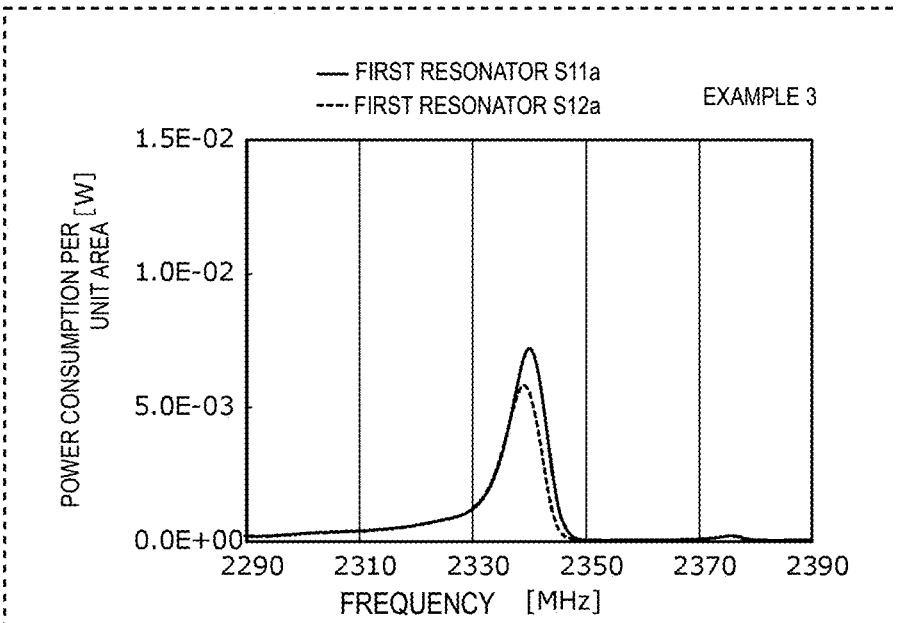
FIGS. 18A and 18B are diagrams showing power consumption of the first resonator and the parallel divided resonator according to Example 3.
Figure 18B:
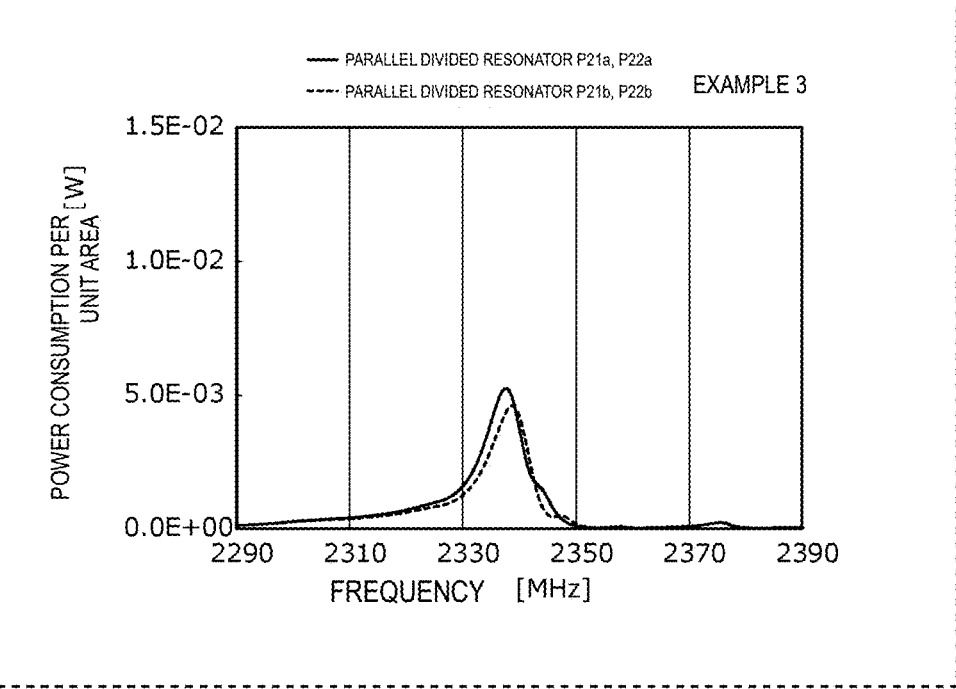

FIGS. 18A and 18B are diagrams showing the power consumption of the first resonator and the parallel divided resonator according to Example 3. FIG. 18A shows the power consumption of the first resonators S11*a* and S12*a*, and FIG. 18B shows the power consumption of the parallel divided resonators P21*a* and P21*b* and the power consumption of the parallel divided resonators P22*a* and P22*b*.

In the example shown in FIG. 18A, the resonant frequency of the first resonator S11*a* moves to the high frequency side, and the resonant frequency of the first resonator S11*a* is higher than the resonant frequency of the first resonator S12*a*. As described above, the resonant frequencies of the two first resonators S11*a* and S12*a* can be shifted by making the electrode finger pitch p of the first resonator S11*a* included in one first divided resonant device S11 different from the electrode finger pitch p of the first resonator S12*a* included in the other first divided resonant device S12. Thus, the power consumption of the acoustic wave resonant circuit 10B can be reduced.

In the present example, the fact that the electrode finger pitches p are different means that a value of a fraction is about 0.0003 or more in a case where a denominator thereof is the electrode finger pitch p of a first resonator included in one first divided resonant device and a numerator thereof is the difference between the electrode finger pitch p of the first resonator included in the one first divided resonant device and the electrode finger pitch p of the first resonator included in the other first divided resonant device. Further, in the present example, the fact that the resonant frequencies fr are different means that a value of a fraction is about 0.0003 or more in a case where a denominator thereof is the resonant frequency of first resonator included in one first divided resonant device and a numerator thereof is the difference between the resonant frequency of first resonator included in the one first divided resonant device and the resonant frequency of first resonator included in the other first divided resonant device.

In the example shown in FIG. 18B, the resonant frequency of the parallel divided resonator P21*b* moves to the high frequency side, and the resonant frequency of the parallel divided resonator P21*b* is higher than the resonant frequency of the parallel divided resonator P21*a*. As described above, the resonant frequencies of the two parallel divided resonators P21*a* and P21*b* can be shifted by making the electrode finger pitch p of one parallel divided resonator P21*a* different from the electrode finger pitch p of the other parallel divided resonator P21*b*. Thus, the power consumption of the acoustic wave resonant circuit 10B can be reduced.

Example 4

An acoustic wave resonant circuit 10C according to Example 4 will be described with reference to FIGS. 19A and 19B. Example 4 is different from Example 1 in a layout of the divided resonant devices.

Figures 19A, 19B:
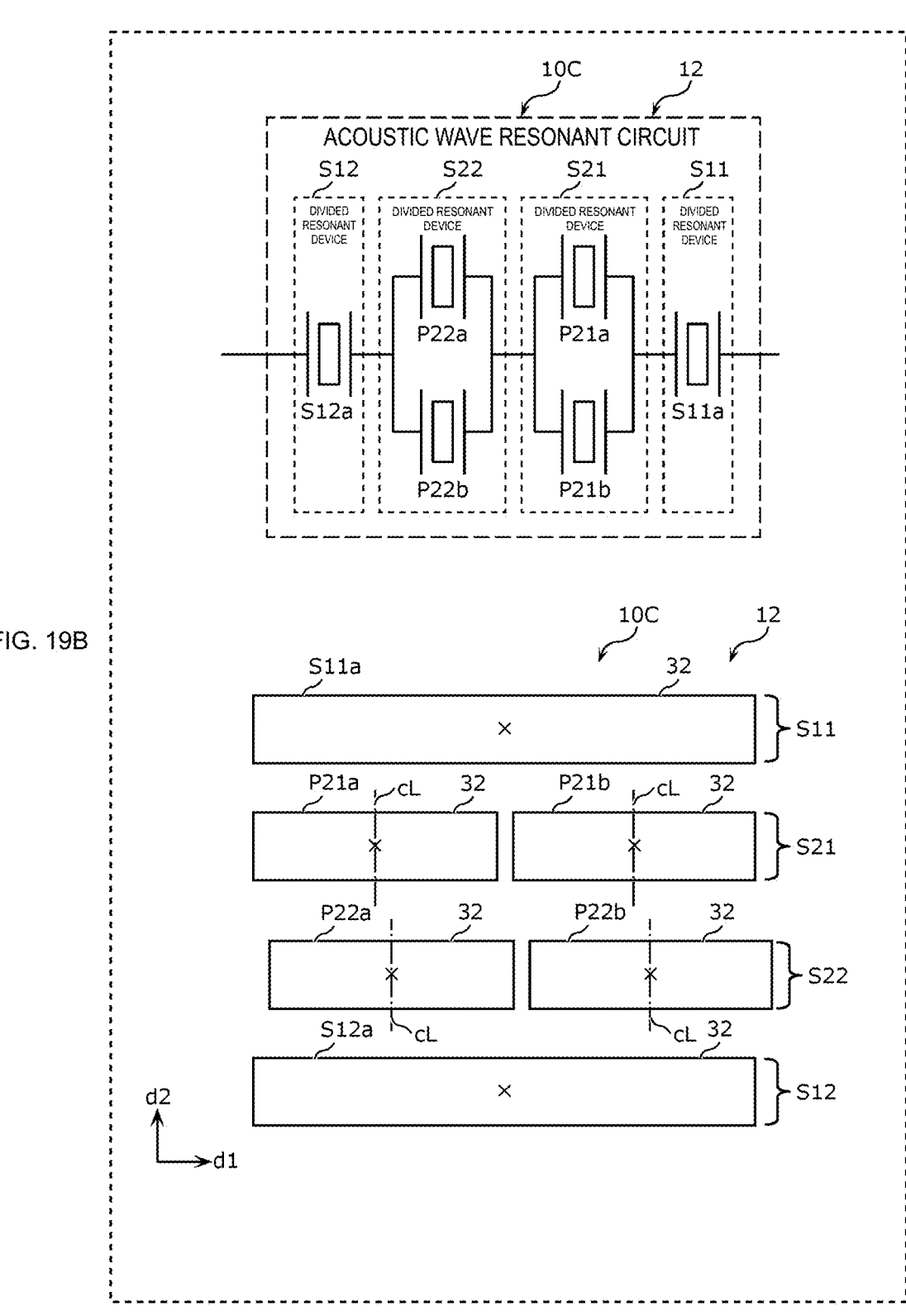
FIGS. 19A and 19B are diagrams showing divided resonant devices included in an acoustic wave resonant circuit of Example 4.

FIGS. 19A and 19B are diagrams showing the divided resonant devices included in the acoustic wave resonant circuit 10C according to Example 4. FIG. 19A shows a circuit configuration of the acoustic wave resonant circuit 10C, and FIG. 19B shows the layout of the divided resonant devices of the acoustic wave resonant circuit 10C. In FIG. 19B, the crossing region of the electrode fingers of the IDT electrode 32 is represented by an oblong shape. A crossing region of the electrode fingers of the IDT electrode 32 is a region that does not include the busbar of the IDT electrode 32 and further does not include a gap between a tip of the electrode finger and the busbar. Further, in FIG. 19B, the maximum amplitude points of the acoustic waves excited by the IDT electrodes 32 are marked with cross symbols. The maximum amplitude point of the IDT electrode 32 is at a center cL of the IDT electrode 32 in the propagation direction d1 of the acoustic wave. The center CL of the IDT electrode 32 is intermediate between the electrode fingers at both ends of the IDT electrode 32 in the propagation direction d1 of the acoustic wave.

As shown in FIG. 19A, the acoustic wave resonant circuit 10C of Example 4 also includes four divided resonant devices. On the path connecting the first terminal T1 and the second terminal T2, the four divided resonant devices are disposed in the order of the first divided resonant device S11, the second divided resonant device S21, the second divided resonant device S22, and the first divided resonant device S12. As described above, in Example 4, the first divided resonant device and the second divided resonant device are not disposed alternately, and in at least a portion thereof, divided resonant devices adjacent to each other are disposed to be the same second divided resonant devices.

As shown in FIG. 19B, the first divided resonant device S11, the second divided resonant device S21, the second divided resonant device S22, and the first divided resonant device S12 are disposed along the "direction d2 in which the electrode fingers extend" which is the same direction as a direction orthogonal or substantially orthogonal to the propagation direction d1 of the acoustic wave.

The two parallel divided resonators P21*a* and P21*b* included in the second divided resonant device S21 are disposed along the propagation direction d1 of the acoustic wave. The two parallel divided resonators P22*a* and P22*b* included in the second divided resonant device S22 are also disposed along the propagation direction d1 of the acoustic wave.

The two second divided resonant devices S21 and S22 are connected to each other in series along the direction d2 in which the electrode fingers extend. In a case where the two second divided resonant devices S21 and S22 are viewed from the direction d2 in which the electrode fingers extend, a position of the center cL of the IDT electrode 32 of each of the two parallel divided resonators P21*a* and P21*b* defining one second divided resonant device S21 is different from the position of the center cL of the IDT electrode 32 of each of the two parallel divided resonators P22a and P22b defining the other second divided resonant device S22.

Specifically, the position of the center cL of the IDT electrode 32 of the parallel divided resonator P21a and the position of the center cL of the IDT electrode 32 of the parallel divided resonator P22a are shifted in the propagation direction d1 of the acoustic wave. Further, the position of the center cL of the IDT electrode 32 of the parallel divided resonator P21b and the position of the center cL of the IDT electrode 32 of the parallel divided resonator P22b are shifted in the propagation direction d1 of the acoustic wave.

For example, in a case where the positions of the centers of the respective IDT electrodes coincide with each other, the temperature becomes locally high at the center of the IDT electrode. As a result, a problem is likely to occur in that the IDT electrode is fused.

Meanwhile, according to the above-described configuration, the maximum amplitude points of each of the second divided resonant device S21 and the second divided resonant device S22 adjacent to each other in the direction d2 in which the electrode fingers extend are spaced from each other. That is, it is difficult for the second divided resonant device S21 and the second divided resonant device S22 to interact in the direction d2 in which the electrode fingers extend. As a result, it is possible to reduce or prevent the local temperature rise of the acoustic wave resonant circuit 10C. Thus, it is possible to reduce or prevent the decrease in electric power handling capability of the acoustic wave filter 1.

Example 5

An acoustic wave resonant circuit 10D according to Example 5 will be described with reference to FIGS. 20A and 20B. Example 5 is different from Example 4 in the layout of the divided resonant devices.

Figures 20A, 20B:
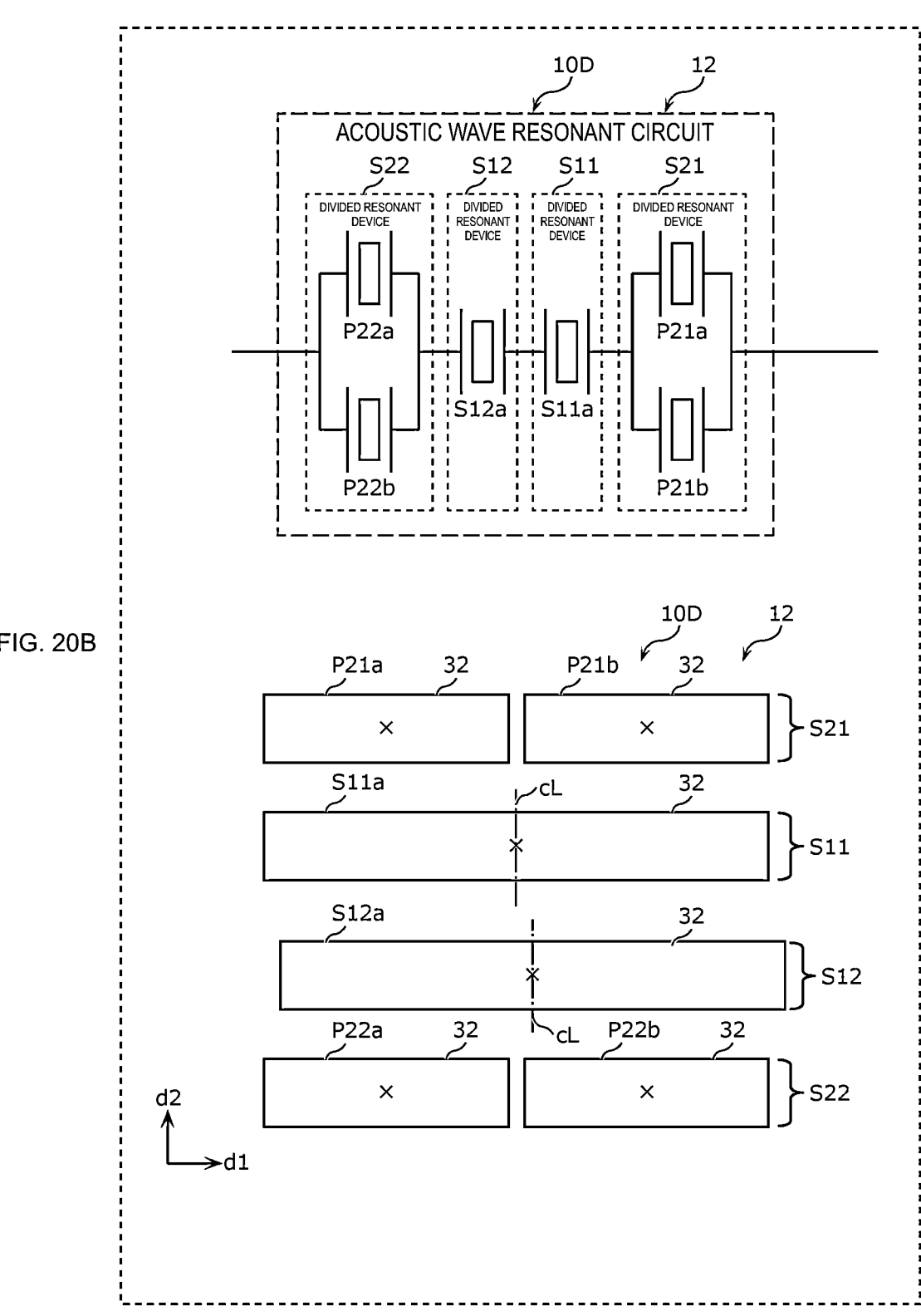
FIGS. 20A and 20B are diagrams showing divided resonant devices included in an acoustic wave resonant circuit of Example 5.

FIGS. 20A and 20B are diagrams showing the divided resonant devices included in the acoustic wave resonant circuit 10D according to Example 5. FIG. 20A shows a circuit configuration of the acoustic wave resonant circuit 10D, and FIG. 20B shows the layout of the divided resonant devices of the acoustic wave resonant circuit 10D. In FIG. 20B, the IDT electrodes 32 are represented by oblong shapes, and the maximum amplitude points of the acoustic waves excited by the IDT electrodes 32 are marked with cross symbols.

As shown in FIG. 20A, the acoustic wave resonant circuit 10D according to Example 5 also includes four divided resonant devices. On the path connecting the first terminal T1 and the second terminal T2, the four divided resonant devices are disposed in the order of the second divided resonant device S21, the first divided resonant device S11, the first divided resonant device S12, and the second divided resonant device S22. As described above, in Example 5, the first divided resonant device and the second divided resonant device are not disposed alternately, and in a portion thereof, divided resonant devices adjacent to each other are disposed to be the same first divided resonant devices.

As shown in FIG. 20B, the second divided resonant device S21, the first divided resonant device S11, the first divided resonant device S12, and the second divided resonant device S22 are disposed along the direction d2 in which the electrode fingers extend.

The two first divided resonant devices S11 and S12 are connected to each other in series along the direction d2 in which the electrode fingers extend. As the two first divided resonant devices S11 and S12 are viewed from the direction d2 in which the electrode fingers extend, a position of the center cL of the IDT electrode 32 of the first resonator S1a defining one first divided resonant device S11 is different from a position of the center cL of the IDT electrode 32 of the first resonator S12a defining the other first divided resonant device S12. Specifically, the position of the center cL of the IDT electrode 32 of the first resonator S11a and the position of the center cL of the IDT electrode 32 of the first resonator S12a are shifted in the propagation direction d1 of the acoustic wave.

According to the above-described configuration, the maximum amplitude points of each of the first divided resonant device S11 and the first divided resonant device S12 adjacent to each other in the direction d2 in which the electrode fingers extend are spaced from each other. That is, it is difficult for the first divided resonant device S11 and the first divided resonant device S12 to interact in the direction d2 in which the electrode fingers extend. As a result, it is possible to reduce or prevent the local temperature rise of the acoustic wave resonant circuit 10D. Thus, it is possible to reduce or prevent the decrease in electric power handling capability of the acoustic wave filter 1.

Summary

The acoustic wave filter 1 according to the above-described example embodiment includes the acoustic wave resonant circuit 10 that is provided in or on at least one of the series arm or the parallel arm. The acoustic wave resonant circuit 10 includes a plurality of divided resonant devices connected to one another in series. The first divided resonant device (for example, S11) among the plurality of divided resonant devices includes one first resonator (for example, S11a). The second divided resonant device (for example, S21) among the plurality of divided resonant devices includes two parallel divided resonators (for example, P21a and P21b) connected to each other in parallel. Each of the first resonator S11a and the parallel divided resonators P21a and P21b includes the IDT electrode 32 including the plurality of electrode fingers. The electrode finger pitch p of the plurality of electrode fingers is different between at least one parallel divided resonator of the two parallel divided resonators P21a and P21b and the first resonator S11a.

As described above, the power consumption of the acoustic wave resonant circuit 10 can be reduced by making the electrode finger pitch p of the parallel divided resonator P21a or P21b different from the electrode finger pitch p of the first resonator S11a and by shifting the resonant frequencies fr from each other. Thus, it is possible to reduce or prevent the temperature rise of the acoustic wave resonant circuit 10 and to reduce or prevent the decrease in electric power handling capability of the acoustic wave filter 1.

Further, the electrode finger pitch p of the parallel divided resonator (for example, P21a) may be less than the electrode finger pitch p of the first resonator S11a.

As described above, by making the electrode finger pitch p of the parallel divided resonator P21a less than the electrode finger pitch p of the first resonator S11a, the resonant frequency fr of the parallel divided resonator P21a can be positioned in the inductive region of the first resonator S11a. With such a configuration, the power input point of the acoustic wave resonant circuit 10 is brought closer to the resonant frequency fr of the parallel divided resonator P21a, and the impedance of the acoustic wave resonant circuit 10 is reduced. As a result, the peak value of the power consumption of the acoustic wave resonant circuit 10 can be reduced. Thus, it is possible to reduce or prevent the temperature rise of the acoustic wave resonant circuit 10 and to reduce or prevent the decrease in electric power handling capability of the acoustic wave filter 1.

Further, the electrode finger pitch p of one parallel divided resonator P21*a* of the two parallel divided resonators P21*a* and P21*b* may be different from the electrode finger pitch p of the other parallel divided resonator P21*b*.

As described above, the power consumption of the acoustic wave resonant circuit 10A can be reduced by making the electrode finger pitch p of the parallel divided resonator P21*a* different from the electrode finger pitch p of the parallel divided resonator P21*b* and by shifting the resonant frequencies fr from each other. Thus, it is possible to reduce or prevent the temperature rise of the acoustic wave resonant circuit 10A and to reduce or prevent the decrease in electric power handling capability of the acoustic wave filter 1.

Further, the maximum value of the electrode finger pitch p of the two parallel divided resonators P21*a* and P21*b* may be less than the minimum value of the electrode finger pitch p of the first resonator S11*a*.

With such a configuration, all of the electrode finger pitches p of the parallel divided resonators P21*a* and P21*b* can be made less than all of the electrode finger pitches p of the first resonator S11*a*. Therefore, the power input point of the acoustic wave resonant circuit 10 is reliably approached to the resonant frequency fr of the parallel divided resonators P21*a* and P21*b*, and the impedance of the acoustic wave resonant circuit 10 is reduced. As a result, the peak value of the power consumption of the acoustic wave resonant circuit 10 can be reduced. Thus, it is possible to reduce or prevent the temperature rise of the acoustic wave resonant circuit 10 and to reduce or prevent the decrease in electric power handling capability of the acoustic wave filter 1.

Further, the acoustic wave resonant circuit 10B includes two first divided resonant devices S11 and S12 and one second divided resonant device S21. The electrode finger pitch p of the first resonator S11*a* included in one first divided resonant device S11 of the two first divided resonant devices S11 may be different from the electrode finger pitch p of the first resonator S12*a* included in the other first divided resonant device S12.

As described above, the power consumption of the acoustic wave resonant circuit 10B can be reduced by making the electrode finger pitch p of the first resonator S11*a* different from the electrode finger pitch p of the first resonator S12*a* and by shifting the resonant frequency fr from each other. Thus, it is possible to reduce or prevent the temperature rise of the acoustic wave resonant circuit 10B and to reduce or prevent the decrease in electric power handling capability of the acoustic wave filter 1.

Further, the acoustic wave resonant circuit 10 may be provided on the path connecting the first terminal T1 and the second terminal T2, and the first divided resonant device and the second divided resonant device may be alternately disposed on the path.

According to the above-described configuration, the maximum amplitude points of each of the first divided resonant device and the second divided resonant device that are adjacent to each other in the direction d2 in which the electrode fingers extend are dispersed. In other words, it is difficult for the divided resonant devices, which are adjacent to each other in the direction d2 in which the electrode fingers extend, to interact, and it is possible to reduce or prevent the local temperature rise of the acoustic wave resonant circuit 10. Thus, it is possible to reduce or prevent the decrease in electric power handling capability of the acoustic wave filter 1.

Further, the acoustic wave resonant circuit 10C includes one first divided resonant device (for example, S11) and two second divided resonant devices S21 and S22. The two second divided resonant devices S21 and S22 are connected to each other in series along the direction d2 in which the electrode fingers extend. As the two second divided resonant devices S21 and S22 are viewed from the direction d2 in which the electrode fingers extend, the position of the center cL, which is intermediate between the electrode fingers at both ends of the IDT electrode 32 of each of the two parallel divided resonators P21*a* and P21*b* defining one second divided resonant device S21 of the two second divided resonant devices S21 and S22, may be different from the position of the center cL which is intermediate between the electrode fingers at both ends of the IDT electrode 32 of each of the two parallel divided resonators P22*a* and P22*b* defining the other second divided resonant device S22.

According to the above-described configuration, the maximum amplitude points of each of the second divided resonant device S21 and the second divided resonant device S22 adjacent to each other in the direction d2 in which the electrode fingers extend are spaced from each other. That is, it is difficult for the second divided resonant device S21 and the second divided resonant device S22 to interact in the direction d2 in which the electrode fingers extend. As a result, it is possible to reduce or prevent the local temperature rise of the acoustic wave resonant circuit 10C. Thus, it is possible to reduce or prevent the decrease in electric power handling capability of the acoustic wave filter 1.

Further, the acoustic wave resonant circuit 10D includes two first divided resonant devices S11 and S12 and one second divided resonant device (for example, S21). The two first divided resonant devices S11 and S12 are connected to each other in series along the direction d2 in which the electrode fingers extend. As the two first divided resonant devices S11 and S12 are viewed from the direction d2 in which the electrode fingers extend, the position of the center cL, which is intermediate between the electrode fingers at both ends of the IDT electrode 32 of the first resonator S11*a* constituting one first divided resonant device S11 of the two first divided resonant devices S11 and S12, may be different from the position of the center cL, which is intermediate between the electrode fingers at both ends of the IDT electrode 32 of the first resonator S12*a* constituting the other first divided resonant device S12.

According to the above-described configuration, the maximum amplitude points of each of the first divided resonant device S11 and the first divided resonant device S12 adjacent to each other in the direction d2 in which the electrode fingers extend are spaced from each other. That is, it is difficult for the first divided resonant device S11 and the first divided resonant device S12 to interact in the direction d2 in which the electrode fingers extend. As a result, it is possible to reduce or prevent the local temperature rise of the acoustic wave resonant circuit 10D. Thus, it is possible to reduce or prevent the decrease in electric power handling capability of the acoustic wave filter 1.

The acoustic wave filter 1 according to the above-described example embodiment includes the acoustic wave resonant circuit 10 in or on at least one of the series arm or the parallel arm. The acoustic wave resonant circuit 10 includes a plurality of divided resonant devices connected to one another in series. The first divided resonant device (for example, S11) among the plurality of divided resonant devices has one first resonator (for example, S11a). The second divided resonant device (for example, S21) among the plurality of divided resonant devices has two parallel divided resonators (for example, P21a and P21b) connected to each other in parallel. The resonant frequency of at least one parallel divided resonator of the two parallel divided resonators (for example, P21a and P21b) is different from the resonant frequency of the first resonator (for example, 11a).

As described above, the power consumption of the acoustic wave resonant circuit 10 can be reduced by making the resonant frequency of the parallel divided resonator different from the resonant frequency of the first resonator and by shifting the resonant frequencies from each other. Thus, it is possible to reduce or prevent the temperature rise of the acoustic wave resonant circuit 10 and to reduce or prevent the decrease in electric power handling capability of the acoustic wave filter 1.

Further, the resonant frequency of one parallel divided resonator P21a of the two parallel divided resonators P21a and P21b may be different from the resonant frequency of the other parallel divided resonator P21b.

As described above, the power consumption of the acoustic wave resonant circuit 10A can be reduced by making the resonant frequency of the parallel divided resonator P21a different from the resonant frequency of the parallel divided resonator P21b and by shifting the resonant frequencies from each other. Thus, it is possible to reduce or prevent the temperature rise of the acoustic wave resonant circuit 10A and to reduce or prevent the decrease in electric power handling capability of the acoustic wave filter 1.

Further, the acoustic wave resonant circuit 10B includes two first divided resonant devices S11 and S12 and one second divided resonant device S21. The resonant frequency of the first resonator S11a included in one first divided resonant device S11 of the two first divided resonant devices S11 may be different from the resonant frequency of the first resonator S12a included in the other first divided resonant device S12.

As described above, the power consumption of the acoustic wave resonant circuit 10B can be reduced by making the resonant frequency of the first resonator S11a different from the resonant frequency of the first resonator S12a and by shifting the resonant frequencies from each other. Thereby, it is possible to reduce or prevent the temperature rise of the acoustic wave resonant circuit 10B and to reduce or prevent the decrease in electric power handling capability of the acoustic wave filter 1.

OTHER EXAMPLE EMBODIMENT

Although the acoustic wave filter according to the present invention has been described above by using example embodiments, the present invention is not limited to the above-described example embodiments. The present invention also includes other example embodiments which are obtained by combining elements in the above-described example embodiments, modified examples which are obtained by making various modifications that can be considered by a person skilled in the art to the above-described example embodiments without departing from the scope of the present invention, and various types of equipment including built-in acoustic wave filters according to example embodiments of the present invention.

For example, in an example embodiment, description has been provided focusing on the acoustic wave resonant circuit 10 of the series arm resonant circuit 11 or 12, but the same applies to the other series arm resonant circuits 13 to 14 and the parallel arm resonant circuits 16 to 18. The same applies not only to the acoustic wave resonant circuit 10 included in the acoustic wave filter 1, but also to the series arm resonant circuits 21 to 25 and the parallel arm resonant circuit 27 included in the other filter 2.

Example embodiments of the present invention can be widely used in communication equipment, such as, for example, a mobile phone, including an acoustic wave filter including divided resonant device.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
   an acoustic wave resonant circuit in or on at least one of a series arm or a parallel arm; wherein
   the acoustic wave resonant circuit includes a plurality of divided resonant devices connected to one another in series;
   a first divided resonant device among the plurality of divided resonant devices includes one first resonator;
   a second divided resonant device among the plurality of divided resonant devices includes two parallel divided resonators connected to each other in parallel;
   each of the first resonator and the parallel divided resonators includes an IDT electrode including a plurality of electrode fingers;
   an electrode finger pitch of the plurality of electrode fingers is different between at least one parallel divided resonator of the two parallel divided resonators and the first resonator; and
   the electrode finger pitch of the at least one parallel divided resonator is less than the electrode finger pitch of the first resonator.

2. The acoustic wave filter according to claim 1, wherein the electrode finger pitch of one parallel divided resonator of the two parallel divided resonators is different from the electrode finger pitch of another parallel divided resonator of the two parallel divided resonators.

3. The acoustic wave filter according to claim 1, wherein a maximum value of the electrode finger pitch of the two parallel divided resonators is less than a minimum value of the electrode finger pitch of the first resonator.

4. The acoustic wave filter according to claim 1, wherein
   the acoustic wave resonant circuit includes two first divided resonant devices and one second divided resonant device; and
   the electrode finger pitch of the first resonator included in one first divided resonant device of the two first divided resonant devices is different from the electrode finger pitch of the first resonator included in another first divided resonant device of the two first divided resonant devices.

5. The acoustic wave filter according to claim 1, wherein the acoustic wave resonant circuit is provided on a path connecting a first terminal and a second terminal, and the first divided resonant device and the second divided resonant device are alternatingly positioned on the path.

6. The acoustic wave filter according to claim 1, wherein the acoustic wave resonant circuit includes two first divided resonant devices and one second divided resonant device;

the two first divided resonant devices are connected to each other in series along a direction in which the electrode fingers extend; and as the two first divided resonant devices are viewed from the direction in which the electrode fingers extend, a center position between the electrode fingers at both ends of the IDT electrode of the first resonator defining one first divided resonant device of the two first divided resonant devices is different from a center position between the electrode fingers at both ends of the IDT electrode of the first resonator defining another first divided resonant device of the two first divided resonant devices.

7. A multiplexer comprising:

a first terminal;

a second terminal;

a third terminal;

the acoustic wave filter according to claim 1; and another filter; wherein the acoustic wave filter is provided on a path connecting the first terminal and the second terminal;

the another filter is provided on a path connecting the second terminal and the third terminal; and an antenna is connected to the second terminal.

8. The multiplexer according to claim 7, wherein the electrode finger pitch of one parallel divided resonator of the two parallel divided resonators is different from the electrode finger pitch of another parallel divided resonator of the two parallel divided resonators.

9. The multiplexer according to claim 7, wherein a maximum value of the electrode finger pitch of the two parallel divided resonators is less than a minimum value of the electrode finger pitch of the first resonator.

10. The-An acoustic wave filter comprising:

an acoustic wave resonant circuit in or on at least one of a series arm or a parallel arm; wherein the acoustic wave resonant circuit includes a plurality of divided resonant devices connected to one another in series;

a first divided resonant device among the plurality of divided resonant devices includes one first resonator;

a second divided resonant device among the plurality of divided resonant devices includes two parallel divided resonators connected to each other in parallel;

each of the first resonator and the parallel divided resonators includes an IDT electrode including a plurality of electrode fingers;

an electrode finger pitch of the plurality of electrode fingers is different between at least one parallel divided resonator of the two parallel divided resonators and the first resonator;

the acoustic wave resonant circuit includes one first divided resonant device and two second divided resonant devices;

the two second divided resonant devices are connected to each other in series along a direction in which the electrode fingers extend; and as the two second divided resonant devices are viewed from the direction in which the electrode fingers extend, a center position between the electrode fingers at both ends of the IDT electrode of each of the two parallel divided resonators defining one second divided resonant device of the two second divided resonant devices is different from a center position between the electrode fingers at both ends of the IDT electrode of each of the two parallel divided resonators defining another second divided resonant device of the two second divided resonant devices.

11. An acoustic wave filter comprising:

an acoustic wave resonant circuit in or on at least one of a series arm or a parallel arm; wherein the acoustic wave resonant circuit includes a plurality of divided resonant devices connected to one another in series;

a first divided resonant device among the plurality of divided resonant devices includes one first resonator;

a second divided resonant device among the plurality of divided resonant devices includes two parallel divided resonators connected to each other in parallel;

a resonant frequency of at least one parallel divided resonator of the two parallel divided resonators is different from a resonant frequency of the first resonator;

the acoustic wave resonant circuit includes one first divided resonant device and two second divided resonant devices;

the two second divided resonant devices are connected to each other in series along a direction in which the electrode fingers extend; and as the two second divided resonant devices are viewed from the direction in which the electrode fingers extend, a center position between the electrode fingers at both ends of the IDT electrode of each of the two parallel divided resonators defining one second divided resonant device of the two second divided resonant devices is different from a center position between the electrode fingers at both ends of the IDT electrode of each of the two parallel divided resonators defining another second divided resonant device of the two second divided resonant devices.

12. The acoustic wave filter according to claim 11, wherein a resonant frequency of one parallel divided resonator of the two parallel divided resonators is different from a resonant frequency of another parallel divided resonator of the two parallel divided resonators.

13. The acoustic wave filter according to claim 11, wherein the acoustic wave resonant circuit is provided on a path connecting a first terminal and a second terminal, and the first divided resonant device and the second divided resonant device are alternatingly positioned on the path.

14. A multiplexer comprising:

a first terminal;

a second terminal;

a third terminal;

the acoustic wave filter according to claim 11; and another filter; wherein the acoustic wave filter is provided on a path connecting the first terminal and the second terminal;

the another filter is provided on a path connecting the second terminal and the third terminal; and an antenna is connected to the second terminal.

15. The multiplexer according to claim 14, wherein a resonant frequency of one parallel divided resonator of the two parallel divided resonators is different from a resonant frequency of another parallel divided resonator of the two parallel divided resonators.

16. An acoustic wave filter comprising:

an acoustic wave resonant circuit in or on at least one of a series arm or a parallel arm; wherein the acoustic wave resonant circuit includes a plurality of divided resonant devices connected to one another in series;

a first divided resonant device among the plurality of divided resonant devices includes one first resonator;

a second divided resonant device among the plurality of divided resonant devices includes two parallel divided resonators connected to each other in parallel;

a resonant frequency of at least one parallel divided resonator of the two parallel divided resonators is different from a resonant frequency of the first resonator;

the acoustic wave resonant circuit includes two first divided resonant devices and one second divided resonant device;

the two first divided resonant devices are connected to each other in series along a direction in which the electrode fingers extend; and as the two first divided resonant devices are viewed from the direction in which the electrode fingers extend, a center position between the electrode fingers at both ends of the IDT electrode of the first resonator defining one first divided resonant device of the two first divided resonant devices is different from a center position between the electrode fingers at both ends of the IDT electrode of the first resonator defining another first divided resonant device of the two first divided resonant devices.

17. The acoustic wave filter according to claim 16 wherein a resonant frequency of the first resonator included in one first divided resonant device of the two first divided resonant devices is different from a resonant frequency of the first resonator included in another first divided resonant device of the two first divided resonant devices.

18. The acoustic wave filter according to claim 16, wherein a resonant frequency of one parallel divided resonator of the two parallel divided resonators is different from a resonant frequency of another parallel divided resonator of the two parallel divided resonators.

19. The acoustic wave filter according to claim 16, wherein the acoustic wave resonant circuit is provided on a path connecting a first terminal and a second terminal, and the first divided resonant device and the second divided resonant device are alternatingly positioned on the path.

20. A multiplexer comprising:

a first terminal;

a second terminal;

a third terminal;

the acoustic wave filter according to claim 14; and another filter; wherein the acoustic wave filter is provided on a path connecting the first terminal and the second terminal;

the another filter is provided on a path connecting the second terminal and the third terminal; and an antenna is connected to the second terminal.

* * * * *